United States Patent
Zhu et al.

(10) Patent No.: US 12,194,519 B2
(45) Date of Patent: Jan. 14, 2025

(54) UNEQUAL-CHANNEL ANGULAR SELF-BENDING EXTRUSION DIE AND METHOD FOR DESIGNING AND MANUFACTURING THE SAME AND EXTRUDING METHOD THEREOF

(71) Applicant: Shandong University of Technology, Shandong (CN)

(72) Inventors: Guangming Zhu, Shandong (CN); Fanlei Min, Shandong (CN); Zheng Chang, Shandong (CN); Huiping Liu, Shandong (CN)

(73) Assignee: Shandong University of Technology, Zibo (CN)

( * ) Notice: Subject to any disclaimer, the term of this patent is extended or adjusted under 35 U.S.C. 154(b) by 982 days.

(21) Appl. No.: 16/972,990

(22) PCT Filed: Sep. 28, 2020

(86) PCT No.: PCT/CN2020/118504
§ 371 (c)(1),
(2) Date: Dec. 7, 2020

(87) PCT Pub. No.: WO2021/248748
PCT Pub. Date: Dec. 16, 2021

(65) Prior Publication Data
US 2023/0094663 A1    Mar. 30, 2023

(30) Foreign Application Priority Data
Jun. 8, 2020   (CN) .......................... 202010520555.4

(51) Int. Cl.
*B21C 23/12*   (2006.01)
*B21C 23/00*   (2006.01)
(Continued)

(52) U.S. Cl.
CPC ............ *B21C 23/12* (2013.01); *B21C 23/002* (2013.01); *B21C 25/02* (2013.01); *B21C 25/10* (2013.01); *G06F 30/17* (2020.01)

(58) Field of Classification Search
CPC ....... B21C 23/12; B21C 23/002; B21C 25/10; B21C 23/001; B21C 25/02; G06F 30/00; G06F 30/17
(Continued)

(56) References Cited

FOREIGN PATENT DOCUMENTS

| CN | 102601141 A | 7/2012 |
| CN | 202591379 U | 12/2012 |

(Continued)

OTHER PUBLICATIONS

Min, Fanlei et al., "Self-Bending Extrusion Molding of Distorted Channels", Jan. 27, 2021, Journal of Mechanical Science and Technology 35 (5), Springer-Verlag GmbH and Springer Nature. (Year: 2021).*

(Continued)

*Primary Examiner* — Cedric Johnson
(74) *Attorney, Agent, or Firm* — Banner & Witcoff, Ltd.

(57) ABSTRACT

Provided are an unequal-channel angular self-bending extrusion die and a method for designing and manufacturing the same and extrusion method thereof and includes following steps: designing a symmetrical streamlined extrusion die based on sine function; making the medial axis of the die cavity of the symmetrical streamlined extrusion die twisted and deformed on a certain plane; establishing the die cavity wall surface equation of the unequal-channel angular self-bending extrusion die; setting a working belt structure downstream the die cavity of the unequal-channel angular self-bending extrusion die.

15 Claims, 2 Drawing Sheets

(51) Int. Cl.
  *B21C 25/02* (2006.01)
  *B21C 25/10* (2006.01)
  *G06F 30/17* (2020.01)

(58) Field of Classification Search
  USPC .......................................................... 703/7, 6
  See application file for complete search history.

(56) References Cited

FOREIGN PATENT DOCUMENTS

| CN | 103678772 A | 3/2014 |
|----|-------------|--------|
| CN | 104874630 A | 9/2015 |
| CN | 104874631 A | 9/2015 |
| CN | 106111718 A | 11/2016 |
| CN | 106378362 A | 2/2017 |
| CN | 206083461 U | 4/2017 |
| CN | 107321809 A | 11/2017 |
| CN | 107649529 A | 2/2018 |
| CN | 108421839 A | 8/2018 |
| CN | 109382417 A | 2/2019 |
| CN | 111151589 A | 5/2020 |
| CN | 111644478 A | 9/2020 |
| JP | S50159504 A | 12/1975 |
| SU | 1657248 A1 | 6/1991 |

OTHER PUBLICATIONS

Min, Fanlei et al., "Influence of Exit Velocity Distribution on Self-Bending Extrusion", Feb. 10, 2020, Engineering Research Express 2, IOP Publishing. (Year: 2020).*

Feb. 25, 2021—(CN) International Search Report—App WO2021248748 (PCT/CN2020/118504).

Feb. 25, 2021—(CN) Written Opinion of the International Searching Authority—App WO2021248748 (PCT/CN2020/118504).

Aug. 24, 2021—(CN) First Office Action—Application No. 2020105205554.

* cited by examiner

UNEQUAL-CHANNEL ANGULAR SELF-BENDING EXTRUSION DIE AND METHOD FOR DESIGNING AND MANUFACTURING THE SAME AND EXTRUDING METHOD THEREOF

CROSS-REFERENCE TO RELATED APPLICATIONS

The present disclosure is a U.S National Phase application of co-pending International Application No. PCT/CN2020/118504, filed Sep. 28, 2020, which claims priority to Chinese Patent Application No. CN202010520555.4, filed with the Chinese Patent Office on Jun. 8, 2020, entitled "Unequal-channel Angular Self-bending Extrusion Die and Method for Designing and Manufacturing the same and Extruding Method Thereof." The entire contents of these application are incorporated herein by reference in their entirety.

TECHNICAL FIELD

The present disclosure relates to the technical field of dies, and in particular to an unequal-channel angular self-bending extrusion die and a method for designing and manufacturing the same and an extruding method thereof.

BACKGROUND ART

Bent aluminum profiles are widely used in such sectors as aerospace, automotive, machinery manufacturing, shipbuilding and chemical industries. With the rapid development of industrial economy, there is an increasing demand for structural parts made of bent aluminum profiles in various fields. Generally, the processing of bent profiles takes the way of bending after extrusion; and the traditional secondary processing technics such as push bending, stretch bending, bending and rolling bending will bring about defects such as aluminum profile's cracking, cross-sectional distortion, instability wrinkling and springback, which seriously impact the forming rate of the bent aluminum profile.

In the prior art, extrusion and bending are used for integrated molding, and a bending device composed of an annular disc or a roller is installed after extruding the die, and the metal is directly entered into the bending device after extrusion, to achieve bending deformation of the profile. Compared with the traditional process, this process combines the advantages of pressure bending and rolling bending, which can reduce defects such as springback or wrinkling, bending instability, but the existence of lateral moment makes these defects impossible to fundamentally avoid, and the outer side of the bending channel will generate resistance to the extruded metal. When the bending arc is large or the extrusion speed is fast, the outer side surface of the profile is subject to a large stress, which will easily cause cross-sectional deformation.

On the other hand, the streamlined extrusion die makes the extrusion process become into a perfect material flow with specific materials and in certain process conditions, resulting in small strain energy and low extrusion load, which is adaptable; but the design and processing of the streamlined extrusion die is difficult, and mostly used in the design of simple symmetrical extrusion dies, which function is limited to extrude straight aluminum profile.

SUMMARY

An objective of the present disclosure is to provide an unequal-channel angular self-bending extrusion die and a method for designing and manufacturing the same and an extruding method thereof, so as to alleviate the technical problems of springback, wrinkling and cross-sectional deformation during bending process for profile in the prior art, and to reduce the load during extrusion.

The present disclosure provides a method for designing an unequal-channel angular self-bending extrusion die, comprising steps of:
  designing a symmetrical streamlined extrusion die based on sine function, wherein the wall surfaces of two sides of the die cavity of the extrusion die are symmetrical streamlined;
  making the medial axis of the die cavity of the symmetrical streamlined extrusion die twisted and deformed in a certain plane, to form an arched curve, wherein the arched curve remains symmetrical along the extrusion direction, and has no offset at both ends of the curve and is tangent to the axis;
  establishing a die cavity wall surface equation of the unequal-channel angular self-bending extrusion die according to the medial axis of the arched curve; and
  setting a working belt structure downstream the die cavity of the unequal-channel angular self-bending extrusion die, with the wall surface of the working belt structure parallel to the extrusion direction.

In a preferred embodiment of the present disclosure, the designing a symmetrical streamlined extrusion die based on a sine function further comprises:
  remaining the shape of die cavity of the extrusion die to be circular along any horizontal section. The boundary curve of the die cavity of the extrusion die is described by a sine function, with the center of the medial axis as the origin and the z direction as the extrusion direction, wherein the left boundary curve function is:

$$\text{Line\_left} = \left(\frac{R-r}{2}\right)\sin\left(\frac{\pi}{L} \cdot z\right)\frac{R+r}{2}$$

while the right boundary curve function is:

$$\text{Line\_right} = -\left(\frac{R-r}{2}\right)\sin\left(\frac{\pi}{L} \cdot z\right) + \frac{R+r}{2}$$

where R is the diameter of the inlet die hole, namely the diameter of the blank; r is the diameter of the exit die hole, namely the diameter of the bar, and L is the height of the die cavity.

In a preferred embodiment of the present disclosure, the making the medial axis of the die cavity of the symmetrical streamlined extrusion die twisted and deformed in a certain plane further comprises:
  the Axis_trig of the twisted medial axis Axis is described as follows based on the trigonometric function:

$$\text{Axis\_trig} = \frac{h}{2}\cos\left(\frac{2\pi}{L} \cdot z\right) + \frac{h}{2}$$

where h is the maximum offset distance of the twisted and deformed medial axis curve.

In a preferred embodiment of the present disclosure, making the medial axis of the die cavity of the symmetrical streamlined extrusion die twisted and deformed in a certain plane further comprises:

the Axis_gauss of the twisted medial axis Axis is described as follows based on the Gauss-like distribution function:

$$\text{Axis\_gauss0} = A \exp(-B \cdot z^2)$$

where A, B are undetermined coefficients.

In a preferred embodiment of the present disclosure, it further comprises a step of:

correcting Axis_gauss0 by mathematical transformation, including first calculating the value of Axis_gauss0 at the end point, which is Axis_gauss0 (L/2), wherein the coefficient A is set as h+Axis_gauss0 (L/2), so as to enlarge the curve height by Axis_gauss (L/2) times and then subtracting Axis_gauss0 (L/2) to obtain the corrected medial axis Axis_gauss based on the Gaussian-like distribution function. The equation is described as:

$$\text{Axis\_gauss} = (h + \text{Axis\_gauss0}(L/2)) \exp(B \cdot z^2) - \text{Axis\_gauss0}(L/2)$$

where the value of coefficient B is an empirical value, when the value of B is 0.01, the distance from the end point of the curve to the original axis can be controlled within 0.01 mm.

In a preferred embodiment of the present disclosure, establishing the die cavity wall surface equation of the unequal-channel angular self-bending extrusion die comprises:

describing the die cavity wall surface as the curved surface equation of:

$$(x - \text{Axis})^2 + y^2 = \left(\frac{R-r}{2}\sin\left(\frac{\pi}{L} \cdot z\right) - \frac{R+r}{2}\right)^2$$

where Axis is Axis_trig or Axis_gauss, respectively.

The present disclosure provides a method for manufacturing an unequal-channel angular self-bending extrusion die based on the method for designing the unequal-channel angular self-bending extrusion die.

The present disclosure provides an unequal-channel angular self-bending extrusion die, made by the method for manufacturing the unequal-channel angular self-bending extrusion die, comprising: a die body;

wherein the die body comprises a die cavity and a working belt structure, the die cavity has a self-bending outlet, with the working belt structure extending along the self-bending outlet of the die cavity, and the working belt structure is integrally connected to the die cavity; and the wall surface of the die cavity is a curved surface equation of:

$$(x - \text{Axis})^2 + y^2 = \left(\frac{R-r}{2}\sin\left(\frac{\pi}{L} \cdot z\right) - \frac{R+r}{2}\right)^2$$

where R is the diameter of the inlet die hole of the die cavity, that is, the diameter of the blank; r is the diameter of the exit die hole of the die cavity, that is, the diameter of the bar; and L is the height of the die cavity, and Axis is the equation of the center axis of the die cavity.

In a preferred embodiment of the present disclosure, the medial axis equation of the die cavity is described as follows based on trigonometric function:

$$\text{Axis\_trig} = \frac{h}{2}\cos\left(\frac{2\pi}{L} \cdot z\right) + \frac{h}{2}$$

where h is the maximum offset distance of the twisted and deformed medial axis curve;

or, based on the Gaussian-like distribution function, the medial axis equation of the die cavity is described as:

$$\text{Axis\_gauss} = (h + \text{Axis\_gauss0}(L/2)) \exp(B \cdot z^2) - \text{Axis\_gauss0}(L/2)$$

where the value of the coefficient B is an empirical value, when the value of B is 0.01, the distance from the end point of the curve to the original axis can be controlled within 0.01 mm; and where Axis is Axis_trig or Axis_gauss, respectively.

The present disclosure provides an extrusion method based on the unequal-channel angular self-bending extrusion die, which comprises a step of:

placing the metal in the die cavity of the die body; and controlling the speed of extruding metal at the inlet of the die cavity; extruding metal based on the self-bending exit of the die cavity and the working belt structure, so as to form a bent profile with a preset curvature.

The present disclosure provides a method for designing an unequal-channel angular self-bending extrusion die, comprising the following steps: designing a symmetrical streamlined extrusion die based on a sine function, wherein the wall surfaces of two sides of the die cavity of the extrusion die is symmetrical streamlined; making the medial axis of the die cavity of the symmetrical streamlined extrusion die twisted and deformed in a certain plane, to form an arched curve, wherein the arched curve remains symmetrical along the extrusion direction, and has no offset at both ends of the curve and is tangent to the axis; establishing a die cavity wall surface equation of the unequal-channel angular self-bending extrusion die according to the medial axis of the arched curve; setting a working belt structure downstream the die cavity of the unequal-channel angular self-bending extrusion die, with the wall surface of the working belt structure parallel to the extrusion direction; designing and forming an unequal-channel angular self-bending extrusion die, wherein after the metal flow passes through the unequal-channel angular self-bending extrusion die, the die cavity of the unequal-channel angular self-bending extrusion die is used to control the extrusion speed to be linearly distributed, so as to directly form bent parts by extrusion, as a result of which the profile is not subject to lateral moment, thereby cross-sectional deformation is reduced or prevented on the outer side surface of the profile, and the flow of the metal during the extrusion process is smoother than that of the conventional stepped extrusion die, and the extrusion load is reduced, alleviating the technical problems of springback, wrinkling and cross-sectional deformation during bending process of the profile in the prior art, and reducing the load during extrusion.

BRIEF DESCRIPTION OF DRAWINGS

With the purpose of more clearly describing the technical solutions in the specific embodiments of the present disclosure or in the prior art, a brief introduction to the drawings that need to be used in the description of the specific embodiments or the prior art will follow. Obviously, the drawings hereunder show some embodiments of the present disclosure. It should be understood that a person ordinarily skilled in the art still could obtain other drawings according to these drawings, without any inventive effort.

Reference Signs: 1—Die body; 11—Die cavity; 12—Working belt structure; 2—Die cavity geometry; 21—Medial axis of symmetrical extrusion die; 22—Left contour line of symmetrical extrusion die; 23—Right contour line of symmetrical extrusion die; 24—Medial axis of the unequal-channel angular self-bending extrusion die; 25—Left contour line of the unequal-channel self-bending extrusion die; 26—Right contour line of the unequal-channel angular self-bending extrusion die; 31—Extruded bent profile.

DETAILED DESCRIPTION OF EMBODIMENTS

The technical solutions of the present disclosure will be described below clearly and completely in connection with examples. It is apparent that the examples to be described are some, but not all of the examples of the present disclosure. All the other examples obtained by those of ordinary skill in the art in light of the examples of the present disclosure without inventive efforts will fall within the scope of the present disclosure as claimed.

It should be noted that this embodiment combines a forming process of the profile, in which extrusion and bending is integrated, with a streamlined extrusion die, and proposes a new process of unequal-channel angular self-bending extrusion forming, enabling metal to flow unevenly in the die cavity, so as to directly extrude the bent profile, in a manner of designing a streamlined extrusion die structure with a twisted medial axis.

Figure 1:
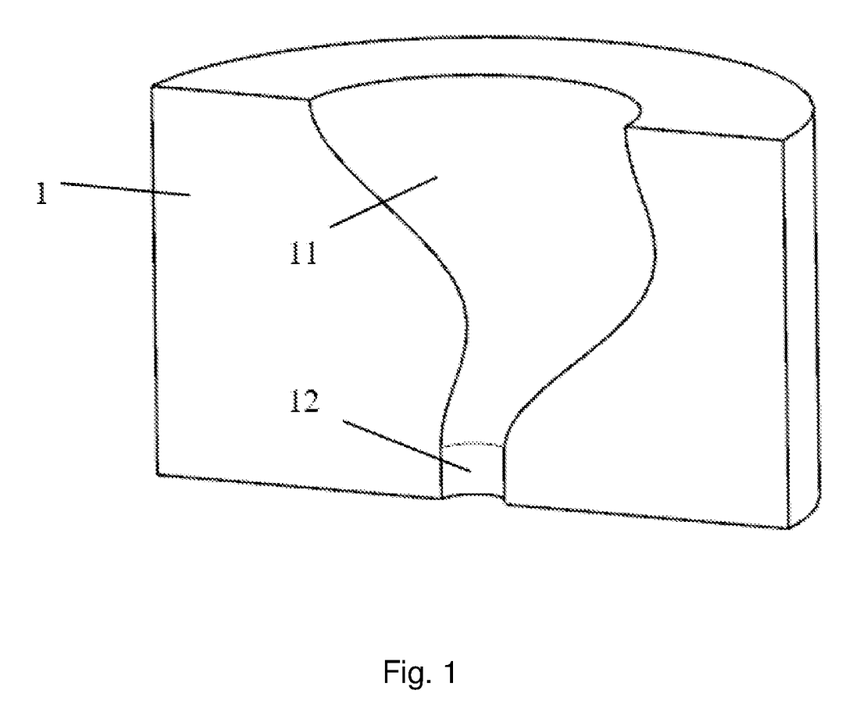
FIG. 1 is a schematic diagram of the overall structure of an unequal-channel angular self-bending extrusion die provided by the embodiment of the present disclosure.
Figure 2:
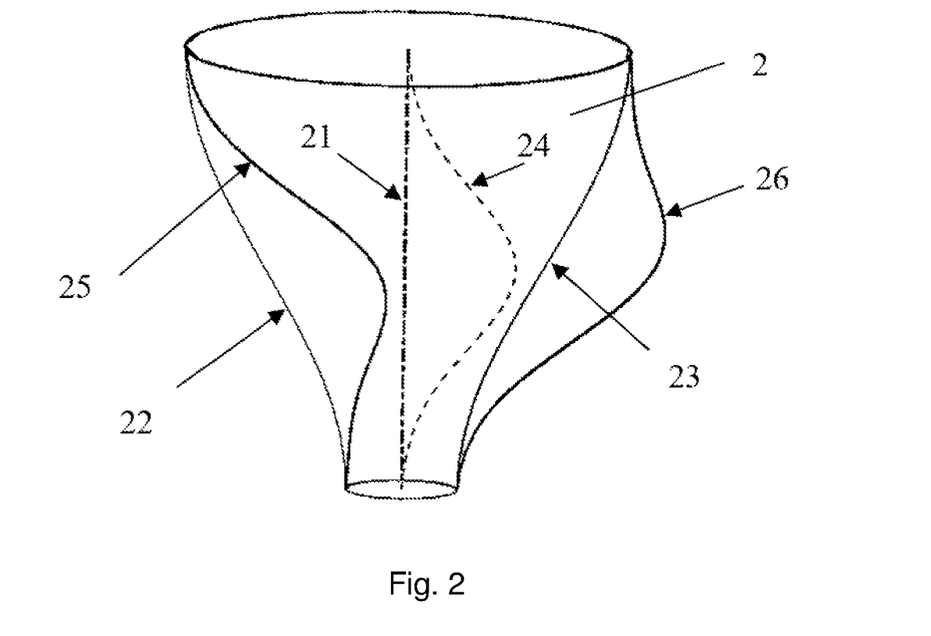
FIG. 2 is a schematic structural diagram of the die cavity of the die body of the unequal-channel angular self-bending extrusion die provided by the embodiment of the present disclosure.
Figure 3:
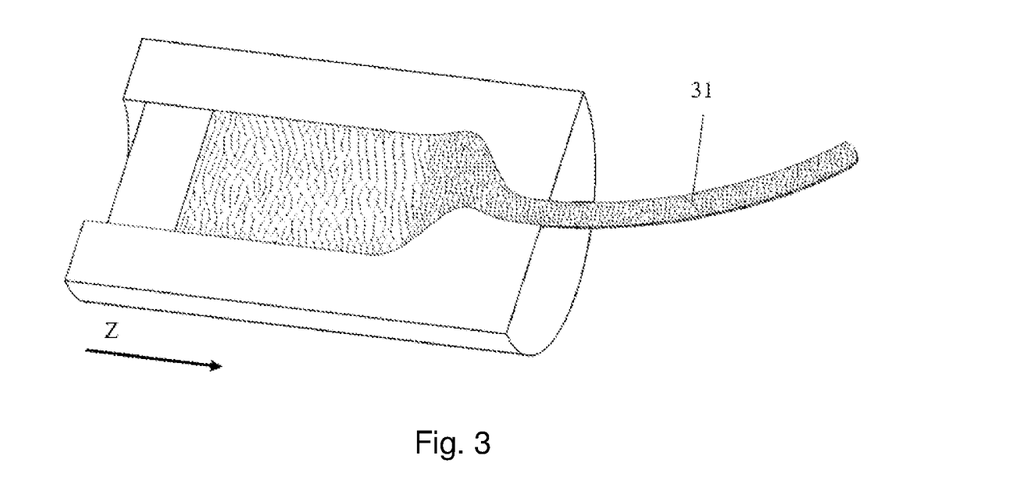
FIG. 3 is a schematic diagram of the numerical calculation results of the profile formed by the extrusion of the unequal-channel angular self-bending extrusion die provided by the embodiment of the present disclosure.

As shown in FIGS. 1 to 3, the method for designing an unequal-channel angular self-bending extrusion die provided by this embodiment comprises the following steps: designing a symmetrical streamlined extrusion die based on sine function, wherein the wall surfaces of two sides of the die cavity 11 of the extrusion die are symmetrical streamlined; making the medial axis of the die cavity 11 of the symmetrical streamlined extrusion die twisted and deformed in a certain plane, to form an arched curve, wherein the arched curve remains symmetrical along the extrusion direction, and has no offset at both ends of the curve and is tangent to the axis; establishing a die cavity 11 wall surface equation of the unequal-channel angular self-bending extrusion die according to the medial axis of the arched curve; and setting a working belt structure 12 downstream the die cavity 11 of the unequal-channel angular self-bending extrusion die, with the wall surface of the working belt structure 12 parallel to the extrusion direction.

The method for designing an unequal-channel angular self-bending extrusion die provided by this embodiment comprises the following steps: designing a symmetrical streamlined extrusion die based on sine function, wherein the wall surfaces of two sides of the die cavity 11 of the extrusion die are symmetrical streamlined; making the medial axis of the die cavity 11 of the symmetrical streamlined extrusion die twisted and deformed in a certain plane, to form an arched curve, wherein the arched curve remains symmetrical along the extrusion direction, and has no offset at both ends of the curve and is tangent to the axis; establishing a die cavity 11 wall surface equation of the unequal-channel angular self-bending extrusion die according to the medial axis of the arched curve; setting a working belt structure 12 downstream the die cavity 11 of the unequal-channel angular self-bending extrusion die, with the wall surface of the working belt structure 12 parallel to the extrusion direction; designing and forming an unequal-channel angular self-bending extrusion die, wherein after the metal flow passes through the unequal-channel angular self-bending extrusion die, the die cavity 11 of the unequal-channel angular self-bending extrusion die is used to control the extrusion speed to be linearly distributed, so as to directly form bent parts by extrusion, as a result of which the profile is not subject to lateral moment, thereby cross-sectional deformation is reduced or prevented on the outer side surface of the profile, and the flow of the metal during the extrusion process is smoother than that of the conventional stepped extrusion die, and the extrusion load is reduced, alleviating the technical problems of springback, wrinkling and cross-sectional deformation during bending process of the profile in the prior art, and reducing the load during extrusion.

The specific design steps as shown in FIG. 2: in a preferred embodiment of the present disclosure, the designing a symmetrical streamlined extrusion die based on a sine function also comprises: remaining the shape of die cavity 11 of the extrusion die to be circular along any horizontal section. The boundary curve of the die cavity 11 of the extrusion die is described by a sine function, with the center of the medial axis 21 of the symmetric extrusion die as the origin and the z direction as the extrusion direction, wherein the function of the left contour line 22 of the symmetric extrusion die is:

$$\text{Line\_left} = \left(\frac{R-r}{2}\right)\sin\left(\frac{\pi}{L}\cdot z\right)\frac{R+r}{2}$$

The function of the right contour line 23 of the symmetrical extrusion die is:

$$\text{Line\_right} = -\left(\frac{R-r}{2}\right)\sin\left(\frac{\pi}{L}\cdot z\right)+\frac{R+r}{2}$$

where R is the diameter of the inlet die hole, that is, the diameter of the blank; r is the diameter of the outlet die hole, that is, the diameter of the bar, and L is the height of the die cavity 11.

In a preferred embodiment of the present disclosure, the making the medial axis of the die cavity 11 of the symmetrical streamlined extrusion die twisted and deformed in a certain plane further comprises: the Axis_trig of the twisted medial axis Axis is described as follows based on the trigonometric function:

$$\text{Axis\_trig} = \frac{h}{2}\cos\left(\frac{2\pi}{L}\cdot z\right)+\frac{h}{2}$$

where h is the maximum offset distance of the twisted and deformed medial axis curve;

In a preferred embodiment of the present disclosure, the making the medial axis of the die cavity 11 of the symmetrical streamlined extrusion die twisted and deformed in a certain plane further comprises:

the Axis_gauss of the twisted medial axis Axis is described as follows based on the Gauss-like distribution function:

Axis_gauss0=$A \exp(-B \cdot z^2)$ where A, B are undetermined coefficients;

wherein the twisted medial axis is the medial axis 24 of unequal-channel angular self-bending extrusion die.

In a preferred embodiment of the present disclosure, it further comprises a step of:

correcting Axis_gauss0 by mathematical transformation, including first calculating the value of Axis_gauss0 at the end point, which is Axis_gauss0 (L/2), wherein the coefficient A is set as h+Axis_gauss0 (L/2), so as to enlarge the curve height by Axis_gauss (L/2) times and then subtracting Axis_gauss0 (L/2) to obtain the corrected medial axis Axis_gauss based on the Gaussian-like distribution function. The equation is described as:

Axis_gauss=$(h+\text{Axis\_gauss0}(L/2))\exp(B \cdot z^2) - \text{Axis\_gauss0}(L/2)$ where the value of the coefficient B is an empirical value, when the value of B is 0.01, the distance from the end point of the curve to the original axis can be controlled within 0.01 mm.

In a preferred embodiment of the present disclosure, the establishing the die cavity 11 wall surface equation of the unequal-channel angular self-bending extrusion die comprises a step of:

describing the wall surface of die cavity 11 as the curved surface equation of:

$$(x - \text{Axis})^2 + y^2 = \left(\frac{R-r}{2}\sin\left(\frac{\pi}{L} \cdot z\right) - \frac{R+r}{2}\right)^2$$

where Axis is Axis_trig or Axis_gauss, respectively.

As shown in FIG. 2, in this embodiment, the steps of the above design method are further explained by using specific values: the designed die is to produce a curved bar with a diameter of D=8 mm, so the radius of the curved bar is r=4 mm, and the original blank is selected as D=40 mm in diameter, so the radius of the original blank is R=20 mm, and the die height is set as L=40 mm based on requirements. According to the designed die cavity geometry 2, the boundary curve of the symmetrical streamlined die cavity 11 is described by a sine function, wherein the origin is the center of the medial axis 21 of the symmetrical extrusion die, and the z direction is set as the extrusion direction, whereby the function Line_left of the left contour line 22 of the symmetrical extrusion die is described as:

$$\text{Line}_{left} = \left(\frac{20-4}{2}\right)\sin\left(\frac{\pi}{40} \cdot z\right) - \frac{20+4}{2}$$

the function Line_right of the right contour line 23 of the symmetrical extrusion die is described as:

$$\text{Line\_right} = -\left(\frac{20-4}{2}\right)\sin\left(\frac{\pi}{40} \cdot z\right) + \frac{20+4}{2}$$

where the wall surface equation of the symmetrical streamlined die cavity 11 is described as:

$$x^2 + y^2 = \left(\frac{20-4}{2}\sin\left(\frac{\pi}{40} \cdot z\right) - \frac{20+4}{2}\right)^2$$

where the maximum offset height of the medial axis 24 of the unequal-channel angular self-bending extrusion die is h=10 mm, and the Axis_trig of the medial axis 24 of the unequal-channel angular self-bending extrusion die is described by trigonometric function as:

$$\text{Axis\_trig} = \frac{10}{2}\cos\left(\frac{2\pi}{40} \cdot z\right) + \frac{10}{2}$$

Another description of Axis_gauss of the medial axis 24 of the unequal-channel angular self-bending extrusion die based on the Gauss-like distribution function is:

Axis_gauss=$(10+0.1832)\exp(0.01 \cdot z^2) - 0.1832$

After the equation Axis of the medial axis 24 of the unequal-channel angular self-bending extrusion die is determined, that is, after the medial axis of the symmetrical streamlined die cavity 11 is twisted and deformed, the other parameters of the die cavity 11 structure are translated accordingly, that is, the shape of the cavity before the deformation remains circular along a certain horizontal section. After deformation, on a plane perpendicular to the extrusion direction, the distance between each of the points on the wall surface of the die cavity 11 and the medial axis 24 of the unequal-channel angular self-bending extrusion die is equal, that is, the section of die cavity 11 is circular, while the position of the center of the circle is different from the original one, which can determine the curved surface equation of the unequal-channel angular die cavity 11 wall surface formed by the left contour line 25 of the unequal-channel angular self-bending extrusion die and the right contour line 26 of the unequal-channel angular self-bending extrusion die, according to the structure principle of the unequal-channel angular self-bending extrusion die, wherein the curved surface equation formulated by Axis_trig of the unequal-channel angular die cavity 11 wall surface of the medial axis 24 of the unequal-channel angular self-bending extrusion die is:

$$\left(x - \frac{10}{2}\cos\left(\frac{2\pi}{40} \cdot z\right) - \frac{10}{2}\right)^2 + y^2 = \left(\frac{20-4}{2}\sin\left(\frac{\pi}{40} \cdot z\right) - \frac{20+4}{2}\right)^2$$

wherein the curved surface equation formulated by Axis_gauss of the unequal-channel angular die cavity 11 wall surface of the medial axis 24 of the unequal-channel angular self-bending extrusion die is:

$$(x - (10+0.1832)\exp(0.01 \cdot z^2) + 0.1832)^2 + y^2 =$$
$$\left(\frac{20-4}{2}\sin\left(\frac{\pi}{40} \cdot z\right) - \frac{20+4}{2}\right)^2$$

Furthermore, upon determination of the unequal-channel angular extrusion die cavity 11, a working belt structure 12 with certain length is set additionally downstream it. The length of the working belt structure 12 may be selected as t=6 mm. The wall surface of the working belt structure 12 is parallel to the extrusion direction.

This embodiment provides a method for manufacturing an unequal-channel angular self-bending extrusion die, which is manufactured based on the method for designing the unequal-channel angular self-bending extrusion die; and this embodiment, based on the designing method aforementioned, is manufactured mechanically using the curved surface equation of the unequal-channel angular die cavity 11 wall surface, thereby an unequal-channel angular self-bending extrusion die can be manufactured.

The present embodiment provides an unequal-channel angular self-bending extrusion die, which is manufactured by the method for manufacturing the unequal-channel angular self-bending extrusion die, comprising: a die body 1;
wherein the die body 1 comprises the die cavity 11 and the working belt structure 12, the die cavity 11 has a self-bending outlet and the working belt structure 12 extends along the self-bending outlet of the die cavity 11, and the working belt structure 12 is integrally connected with the die cavity 11; and the wall surface of the die cavity 11 is a curved surface equation of:

$$(x - \text{axis})^2 + y^2 = \left(\frac{R-r}{2}\sin\left(\frac{\pi}{L} \cdot z\right) - \frac{R+r}{2}\right)^2$$

where R is the diameter of the inlet die hole of the die cavity 11, that is, the diameter of the blank; r is the diameter of the outlet die hole of the die cavity 11, that is, the diameter of the bar; L is the height of the die cavity 11, and Axis is the equation of the medial axis of the die cavity 11.

In the preferred embodiment of the present disclosure, the medial axis equation of the die cavity 11 is described as follows based on trigonometric function:

$$\text{Axis\_trig} = \frac{h}{2}\cos\left(\frac{2\pi}{L} \cdot z\right) + \frac{h}{2}$$

where h is the maximum offset distance of the twisted and deformed medial axis curve;
or the medial axis equation of the die cavity 11 is described based on the Gaussian-like distribution function as, $$\text{Axis\_gauss} = (h + \text{Axis\_gauss0}(L/2))\exp(B \cdot z^2) - \text{Axis\_gauss0}(L/2)$$

where the value of the coefficient B is an empirical value, when the value of B is 0.01, the distance from the end point of the curve to the original axis can be controlled within 0.01 mm;
where Axis is Axis_trig or Axis_gauss, respectively.

In this embodiment, adding the working belt structure 12 can extend the deformation coordination of metal, reduce the difference in metal flow speed in the channel of the working belt structure 12, and reduce the uneven level of the extrusion speed, hence reducing the degree of bending. Therefore, adding the working belt structure 12 can be used to design the extrusion of profiles with different bending curvatures.

This embodiment provides an extrusion method based on the unequal-channel angular self-bending extrusion die, which comprises the following steps: placing metal in the die cavity 11 of the die body 1; controlling the speed of extruding the metal at the inlet of the die cavity 11; based on the self-bending outlet of the die cavity 11 and the working belt structure 12, extruding metal to form a bent profile with a preset curvature, thereby forming an extruded bent profile 31.

In this embodiment, the process parameters of the extrusion method comprise: the material of the blank is AA6063 aluminum alloy, the extrusion ratio $\lambda=25$, the extrusion speed v=10 mm/s, the preheating temperature of the blank is 450° C., and the preheating temperature of the extrusion barrel is 470° C., the preheating temperature of the extrusion die is 480° C.; the shear friction model is applied between the blank and the die, with the friction factor being set to 0.7, and the Coulomb friction model is applied between the blank and the working belt, with the friction factor being set to 0.3; according to symmetry, simulation is performed on ½ of the entire model, and all components are divided into tetrahedral elements, the mesh number of blank is 30,000, and the displacement step size is 0.2 mm.

As shown in FIG. 3, a mesh diagram for the simulation result of the deformed body when numerical calculation is performed on the extruded bent profile 31 which is formed by the unequal-channel angular self-bending extrusion die of the embodiment of the present disclosure is shown. During the extrusion process, the metal flow rate at the outlet of the die cavity 11 is linearly distributed. When the profile is extruded, it will naturally bend to the side with slower flow rate, to allow for the natural bending and forming of bar profile of aluminum alloy, thereby one-time extruding high-quality products with a certain curvature while the extrusion load is lower than that of conventional dies.

As shown in FIG. 3, in addition, when metal enters the die, the strain is always greater toward the left on the same horizontal line, that is, the strain of the metal on the convex edge of the die (left side) is greater than that on the concave side of the die (right side). The strain reaches the maximum at the outlet of the die, therefore the deformation on the left is always greater than that on the right. Due to the deformation coordination of metal, the extruded profile bends to the right.

It should be noted that the "left", "right" and "z direction" mentioned in the present disclosure all relate to the position of the unequal-channel angular self-bending extrusion die when it is working, which is only intended for a smooth description, and shall not impose limitations on the present disclosure.

Finally, it should be noted that the above embodiments are merely intended to illustrate the technical solutions of the present disclosure, but not intended to limit the present disclosure. Although the present disclosure has been described in detail with reference to the foregoing embodiments, it should be understood by those of ordinary skill in the art that the technical solutions disclosed in the foregoing embodiments may still be modified, or some or all of the technical features therein may be replaced with equivalents. Such modifications or replacements will not cause the essence of the corresponding technical solutions to depart from the scope of the technical solutions of the embodiments of the present disclosure.

What is claimed is:

1. A method for designing an unequal-channel angular self-bending extrusion die, comprising steps of:
   designing a symmetrical streamlined extrusion die based on a sine function, wherein wall surfaces of two sides of a die cavity of the extrusion die are symmetrical streamlined;
   making a medial axis of the die cavity of the symmetrical streamlined extrusion die twisted and deformed in a certain plane, to form an arched curve, wherein the arched curve remains symmetrical along an extrusion direction, has no offset at both ends of the curve and is tangent to an axis;
   establishing a wall surface equation of the die cavity of the unequal-channel angular self-bending extrusion die according to a medial axis of the arched curve; and
   setting a working belt structure behind the die cavity of the unequal-channel angular self-bending extrusion die, with a wall surface of the working belt structure parallel to the extrusion direction.

2. The method for designing an unequal-channel angular self-bending extrusion die according to claim 1, wherein the designing a symmetrical streamlined extrusion die based on a sine function further comprises:
   remaining a shape of the die cavity of the extrusion die on any horizontal section to be circular, wherein a boundary curve of the die cavity of the extrusion die is described by a sine function, with a center of the medial axis as an origin and a z direction as the extrusion direction, wherein a left boundary curve function is:

$$\text{Line\_left} = \left(\frac{R-r}{2}\right)\sin\left(\frac{\pi}{L} \cdot z\right) - \frac{R+r}{2}$$

and a right boundary curve function is:

$$\text{Line\_right} = -\left(\frac{R-r}{2}\right)\sin\left(\frac{\pi}{L} \cdot z\right) + \frac{R+r}{2}$$

where R is a diameter of an inlet die hole, namely a diameter of a blank; r is a diameter of an exit die hole, namely a diameter of a bar; and L is a height of the die cavity.

3. The method for designing an unequal-channel angular self-bending extrusion die according to claim 2, wherein the making a medial axis of the die cavity of the symmetrical streamlined extrusion die twisted and deformed in a certain plane further comprises:
   an Axis_trig of a twisted medial axis Axis is described based on a trigonometric function as follows:

$$\text{Axis\_trig} = \frac{h}{2}\cos\left(\frac{2\pi}{L} \cdot z\right) + \frac{h}{2}$$

where h is a maximum offset distance of a twisted and deformed medial axis curve.

4. The method for designing an unequal-channel angular self-bending extrusion die according to claim 2, wherein the making a medial axis of the die cavity of the symmetrical streamlined extrusion die twisted and deformed in a certain plane further comprises:
   an Axis_gauss of a twisted medial axis Axis is described based on a Gauss-like distribution function as follows:

$$\text{Axis\_gauss0} = A \exp(-B \cdot z^2)$$

where A, B are undetermined coefficients.

5. The method for designing an unequal-channel angular self-bending extrusion die according to claim 4, further comprises a step of:
   correcting Axis_gauss0 by a mathematical transformation, comprising first calculating a value of Axis_gauss0 at an end point, which is Axis_gauss0 (L/2), wherein the coefficient A is set as h+Axis_gauss0 (L/2), so as to enlarge a height of the curve by Axis_gauss (L/2) times, and then subtracting Axis_gauss0 (L/2) to obtain a corrected medial axis Axis_gauss based on the Gaussian-like distribution function, wherein the equation is described as:

$$\text{Axis\_gauss} = (h + \text{Axis\_gauss0}(L/2))\exp(B \cdot z^2) - \text{Axis\_gauss0}(L/2)$$

where a value of the coefficient B is an empirical value, wherein when a value of the B is 0.01, a distance from the end point of the curve to an original axis is able to be controlled within 0.01 mm.

6. The method for designing an unequal-channel angular self-bending extrusion die according to claim 5, wherein the establishing a wall surface equation of the die cavity of the unequal-channel angular self-bending extrusion die comprises:
   describing a wall surface of the die cavity as a curved surface equation of:

$$(x - \text{Axis})^2 + y^2 = \left(\frac{R-r}{2}\sin\left(\frac{\pi}{L} \cdot z\right) - \frac{R+r}{2}\right)^2$$

where Axis is Axis_trig or Axis_gauss, respectively.

7. The method for manufacturing an unequal-channel angular self-bending extrusion die according to claim 6, wherein the making a medial axis of the die cavity of the symmetrical streamlined extrusion die twisted and deformed in a certain plane further comprises:
   an Axis_trig of a twisted medial axis Axis is described based on a trigonometric function as follows:

$$\text{Axis\_trig} = \frac{h}{2}\cos\left(\frac{2\pi}{L} \cdot z\right) + \frac{h}{2}$$

where h is a maximum offset distance of a twisted and deformed medial axis curve.

8. The method for manufacturing an unequal-channel angular self-bending extrusion die according to claim 7, further comprises a step of:
   correcting Axis_gauss0 by a mathematical transformation, comprising first calculating a value of Axis_gauss0 at an end point, which is Axis_gauss0 (L/2), wherein the coefficient A is set as h+Axis_gauss0 (L/2), so as to enlarge a height of the curve by Axis_gauss (L/2) times, and then subtracting Axis_gauss0 (L/2) to obtain a corrected medial axis Axis_gauss based on the Gaussian-like distribution function, wherein the equation is described as:

$$\text{Axis\_gauss} = (h + \text{Axis\_gauss0}(L/2))\exp(B \cdot z^2) - \text{Axis\_gauss0}(L/2)$$

where a value of the coefficient B is an empirical value, wherein when a value of the B is 0.01, a distance from the end point of the curve to an original axis is able to be controlled within 0.01 mm.

9. The method for designing an unequal-channel angular self-bending extrusion die according to claim 4 or 5, wherein the establishing a wall surface equation of the die cavity of the unequal-channel angular self-bending extrusion die comprises:

describing a wall surface of the die cavity as a curved surface equation of:

$$(x - \text{Axis})^2 + y^2 = \left(\frac{R-r}{2}\sin\left(\frac{\pi}{L} \cdot z\right) - \frac{R+r}{2}\right)^2$$

where Axis is Axis_trig or Axis_gauss, respectively; and x and y are coordinate values of horizontal and vertical coordinates of any point on the curved surface in a spatial coordinate system, respectively.

10. The method for manufacturing an unequal-channel angular self-bending extrusion die according to claim 6, wherein the making a medial axis of the die cavity of the symmetrical streamlined extrusion die twisted and deformed in a certain plane further comprises:

an Axis_gauss of a twisted medial axis Axis is described based on a Gauss-like distribution function as follows:

Axis_gauss0=$A \exp(-B \cdot z^2)$ where A, B are undetermined coefficients.

11. The method for manufacturing an unequal-channel angular self-bending extrusion die according to claim 7, wherein the establishing a wall surface equation of the die cavity of the unequal-channel angular self-bending extrusion die comprises:

describing a wall surface of the die cavity as a curved surface equation of:

$$(x - \text{Axis})^2 + y^2 = \left(\frac{R-r}{2}\sin\left(\frac{\pi}{L} \cdot z\right) - \frac{R+r}{2}\right)^2$$

where Axis is Axis_trig or Axis_gauss, respectively; and x and y are coordinate values of horizontal and vertical coordinates of any point on the curved surface in a spatial coordinate system, respectively.

12. A method for manufacturing an unequal-channel angular self-bending extrusion die, wherein the unequal-channel angular self-bending extrusion die is manufactured based on the method for designing an unequal-channel angular self-bending extrusion die according to claim 1.

13. An unequal-channel angular self-bending extrusion die, manufactured by the method for manufacturing an unequal-channel angular self-bending extrusion die according to claim 7, comprising: a die body, wherein the die body comprises a die cavity and a working belt structure, the die cavity has a self-bending outlet, with the working belt structure extending along the self-bending outlet of the die cavity, and the working belt structure is integrally connected to the die cavity; and the wall surface of the die cavity is described as a curved surface equation of:

$$(x - \text{Axis})^2 + y^2 = \left(\frac{R-r}{2}\sin\left(\frac{\pi}{L} \cdot z\right) - \frac{R+r}{2}\right)^2$$

where R is the diameter of the inlet die hole of the die cavity, that is, the diameter of the blank; r is the diameter of the exit die hole of the die cavity, and that is, the diameter of the bar; L is the height of the die cavity; and Axis is an equation of the medial axis of the die cavity; and x and y are coordinate values of horizontal and vertical coordinates of any point on the curved surface in a spatial coordinate system, respectively.

14. The unequal-channel angular self-bending extrusion die according to claim 13, wherein the equation of the medial axis of the die cavity is described based on a trigonometric function as follows:

$$\text{Axis\_trig} = \frac{h}{2}\cos\left(\frac{2\pi}{L} \cdot z\right) + \frac{h}{2}$$

where h is the maximum offset distance of the twisted and deformed medial axis curve;

or the equation of the medial axis of the die cavity is described based on a Gaussian-like distribution function as follows:

Axis_gauss=$(h+\text{Axis\_gauss0}(L/2))\exp(B \cdot z^2)-$
    Axis_gauss0$(L/2)$ where the value of the coefficient B is an empirical value, wherein when the value of the B is 0.01, the distance from the end point of the curve to the original axis is able to be controlled within 0.01 mm;

where Axis is Axis_trig or Axis_gauss, respectively.

15. The method for manufacturing an unequal-channel angular self-bending extrusion die according to claim 12, wherein the designing a symmetrical streamlined extrusion die based on a sine function further comprises:

remaining a shape of the die cavity of the extrusion die on any horizontal section to be circular, wherein a boundary curve of the die cavity of the extrusion die is described by a sine function, with a center of the medial axis as an origin and a z direction as the extrusion direction, wherein a left boundary curve function is:

$$\text{Line\_left} = \left(\frac{R-r}{2}\right)\sin\left(\frac{\pi}{L} \cdot z\right) - \frac{R+r}{2}$$

and a right boundary curve function is:

$$\text{Line\_right} = -\left(\frac{R-r}{2}\right)\sin\left(\frac{\pi}{L} \cdot z\right) + \frac{R+r}{2}$$

where R is a diameter of an inlet die hole, namely a diameter of a blank; r is a diameter of an exit die hole, namely a diameter of a bar; and L is a height of the die cavity.

* * * * *